United States Patent
Yamada et al.

(10) Patent No.: US 10,801,106 B2
(45) Date of Patent: Oct. 13, 2020

(54) SHOWER PLATE STRUCTURE FOR EXHAUSTING DEPOSITION INHIBITING GAS

(71) Applicant: ASM IP HOLDING B.V., Almere (NL)

(72) Inventors: Ryoko Yamada, Odawara (JP); Jun Kawahara, Hachioji (JP); Kazuo Sato, Kawasaki (JP)

(73) Assignee: ASM IP HOLDING B.V., Almere (NL)

( * ) Notice: Subject to any disclaimer, the term of this patent is extended or adjusted under 35 U.S.C. 154(b) by 413 days.

(21) Appl. No.: 15/380,557

(22) Filed: Dec. 15, 2016

(65) Prior Publication Data

US 2018/0171472 A1    Jun. 21, 2018

(51) Int. Cl.
| | | |
|---|---|---|
| *C23C 16/44* | (2006.01) | |
| *C23C 16/455* | (2006.01) | |
| *B05B 16/60* | (2018.01) | |
| *H01J 37/32* | (2006.01) | |

(52) U.S. Cl.
CPC .......... *C23C 16/4412* (2013.01); *B05B 16/60* (2018.02); *C23C 16/4409* (2013.01); *C23C 16/45565* (2013.01); *H01J 37/3244* (2013.01); *H01J 37/32633* (2013.01); *H01J 37/32834* (2013.01)

(58) Field of Classification Search
CPC .......... C23C 16/45565; C23C 16/4412; H01J 37/3244; H01J 37/32633; H01J 37/32834
See application file for complete search history.

(56) References Cited

U.S. PATENT DOCUMENTS

| | | |
|---|---|---|
| 8,083,853 B2 | 12/2011 | Choi et al. |
| D665,055 S | 8/2012 | Yanagisawa et al. |
| 8,402,918 B2 | 3/2013 | Kadkhodayan et al. |
| D720,838 S | 1/2015 | Yamagishi et al. |
| D724,701 S | 3/2015 | Yamagishi et al. |
| D732,145 S | 6/2015 | Yamagishi et al. |
| D732,644 S | 6/2015 | Yamagishi et al. |
| D733,257 S | 6/2015 | Schoenherr et al. |
| D733,261 S | 6/2015 | Yamagishi et al. |
| D733,843 S | 7/2015 | Yamagishi et al. |
| D735,836 S | 8/2015 | Yamagishi et al. |
| D751,176 S | 3/2016 | Schoenherr et al. |

(Continued)

OTHER PUBLICATIONS

Korean Office Action dated Jan. 12, 2018 in corresponding Korean Patent Application No. 30-2017-0023146.

(Continued)

*Primary Examiner* — Matthew J Song
(74) *Attorney, Agent, or Firm* — Pillsbury Winthrop Shaw Pittman, LLP

(57) ABSTRACT

A shower plate adapted to be installed in a plasma deposition apparatus including a gas inlet port, a shower head, a reaction chamber and an exhaust duct, the shower plate being adapted to be attached to the showerhead and having: a front surface adapted to face the gas inlet port; and a rear surface opposite to the front surface, wherein the shower plate has multiple apertures each extending from the front surface to the rear surface, and wherein the shower plate further has at least one aperture extending from the front surface side of the shower plate to the exhaust duct.

20 Claims, 8 Drawing Sheets

(56) References Cited

U.S. PATENT DOCUMENTS

| | | |
|---|---|---|
| D785,766 S | 5/2017 | Sato |
| D787,458 S | 5/2017 | Kim et al. |
| D789,888 S | 6/2017 | Jang et al. |
| D793,526 S | 8/2017 | Behdjat |
| D794,753 S | 8/2017 | Miller |
| 2005/0103265 A1* | 5/2005 | Gianoulakis ........ C23C 16/4412 118/715 |
| 2010/0003829 A1 | 1/2010 | Patrick et al. |
| 2011/0297759 A1 | 12/2011 | Morbio |
| 2013/0025787 A1* | 1/2013 | Yang ................. H01J 37/32633 156/345.29 |
| 2014/0273528 A1 | 9/2014 | Niskanen et al. |
| 2015/0299860 A1* | 10/2015 | Je ...................... H01L 21/67103 165/48.1 |
| 2016/0040410 A1 | 2/2016 | Carpenter-Crawford |
| 2016/0042925 A1* | 2/2016 | Yang ................... H01J 37/3244 156/345.33 |

OTHER PUBLICATIONS

Non-Final Office Action dated Feb. 6, 2018 in corresponding U.S. Appl. No. 29/587,855.

\* cited by examiner

FIG.4
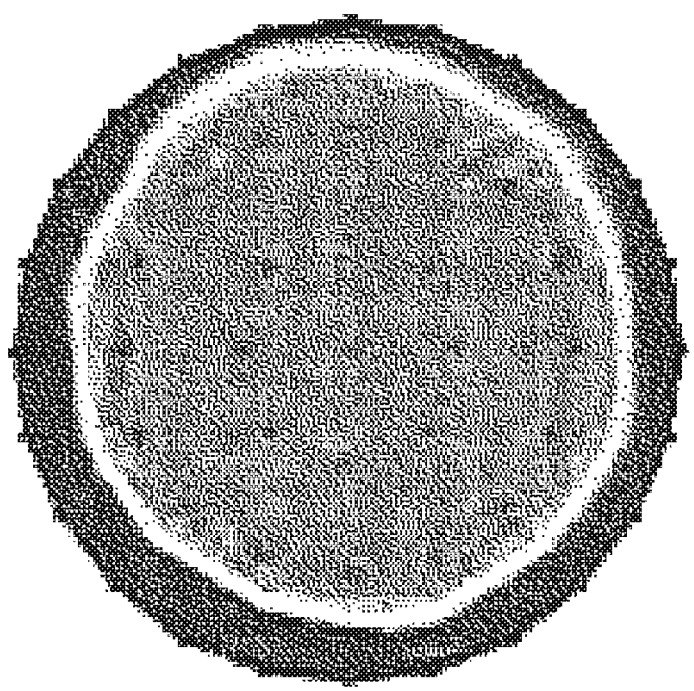
0.97　　　　　　　　1.03

FIG.7
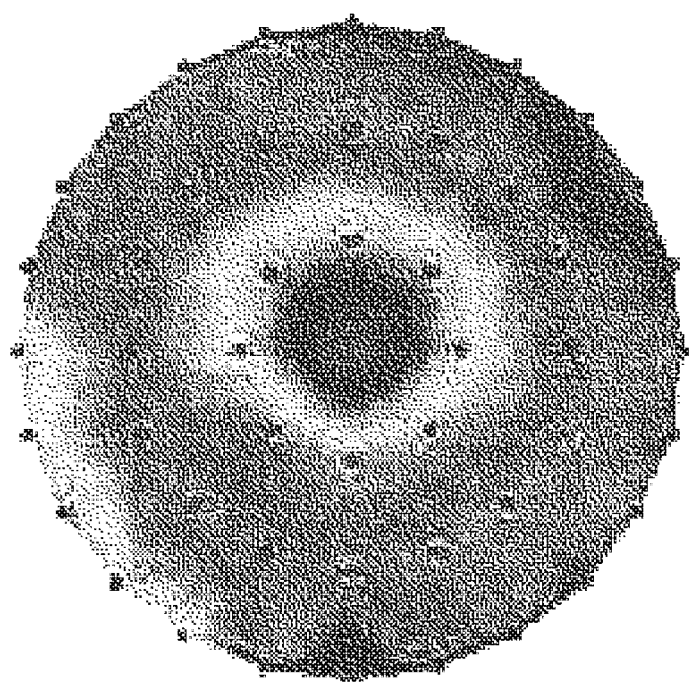
0.97                1.03

SHOWER PLATE STRUCTURE FOR EXHAUSTING DEPOSITION INHIBITING GAS

BACKGROUND OF THE INVENTION

1. Field of the Invention

The present invention relates generally to a plasma deposition apparatus used in a semiconductor manufacturing process, in particular to a shower plate structure provided in the apparatus.

2. Description of the Related Art

Plasma enhanced CVD (PECVD) and plasma enhanced ALD (PEALD) processes are generally used to deposit films on a patterned surface of a substrate, such as a semiconductor wafer. Those processes are typically accomplished by introducing a precursor gas or gas mixture into a chamber that contains a substrate. The precursor gas or gas mixture is usually directed downwardly via a shower plate located around the top of the chamber.

The precursor gas or gas mixture provided in the chamber is then energized or excited into a plasma by applying radio frequency (RF) power to the chamber from one or more RF sources coupled to the reaction chamber. The excited gas or gas mixture reacts to form a layer of material on a surface of the substrate that is positioned on a temperature controlled substrate support. By-products produced during the reaction (e.g., deposition inhibiting gas) are pumped from the chamber through an exhaust system.

FIG. 1 shows an overview of a conventional shower head 1 having a shower plate structure 2 and a shield plate 3 which define a gas inlet space. The shower plate structure 2 and the shield plate 3 are fixed to one another with a screw 5. An O-ring 4 is attached between the shower plate structure 2 and the shield plate 3. The precursor gas or gas mixture in the gas inlet space is introduced via a number of holes of the shower plate structure into the chamber.

Any discussion of the background art which has been included in the present disclosure is solely for the purpose of providing a context for the present invention, and it should not be taken as an admission that any or all of the discussion form part of the prior art or were known in the art at the time the invention was made.

SUMMARY

In recent years, methods for depositing a film on a patterned surface have been proposed by improving the structure of the shower plate. The demand for forming a film more uniformly on the patterned surface is ever increasing. However, forming a film with a conventional shower head may be difficult. One reason is a problem of by-products remaining between the shower plate structure and the shield plate, e.g., both ends of the gas inlet space and areas around the O-ring 4, which poses a negative impact on uniform deposition of the film on the surface of a substrate. Thus development of the shower head which is capable of exhausting such by-products outside of the shower head and the chamber becomes important to help increase the uniformity of the film formed on the surface of the substrate.

In an aspect, an embodiment of the present invention provides a shower plate adapted to be installed in a plasma deposition apparatus comprising a gas inlet port, a shower head, a susceptor, a reaction chamber and an exhaust duct, the shower plate being adapted to be attached to the showerhead and comprising: a front surface adapted to face the gas inlet port; and a rear surface opposite to the front surface, and the shower plate has multiple apertures each extending from the front surface to the rear surface, and the shower plate further has at least one aperture extending from the front surface side of the shower plate to the exhaust duct.

In some embodiments, the shower plate further has a stepped section on the front surface side of the shower plate, the front surface being surrounded peripherally (e.g., circumferentially) by the stepped section and the at least one aperture extending from the stepped section to the exhaust duct. In some embodiments, the shower plate has the at least one aperture extending from the front surface to the exhaust duct.

For purposes of summarizing aspects of the invention and one or more advantages achieved over the related art, certain objects and advantages of the invention are described in this disclosure. Of course, it is to be understood that not necessarily all or any such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving one or more other objects or advantages as may be taught or suggested herein. Further aspects, features and advantages of this invention will become apparent from the detailed description which follows.

These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

FIG. 4 is a map of thickness ratio of each location of film formed on the surface of a substrate in the case of Example 1.

FIG. 7 is a map of thickness ratio of each location of film formed on the surface of a substrate in the case of Example 3.

DESCRIPTION OF THE PREFERRED EMBODIMENTS

Figure 1:
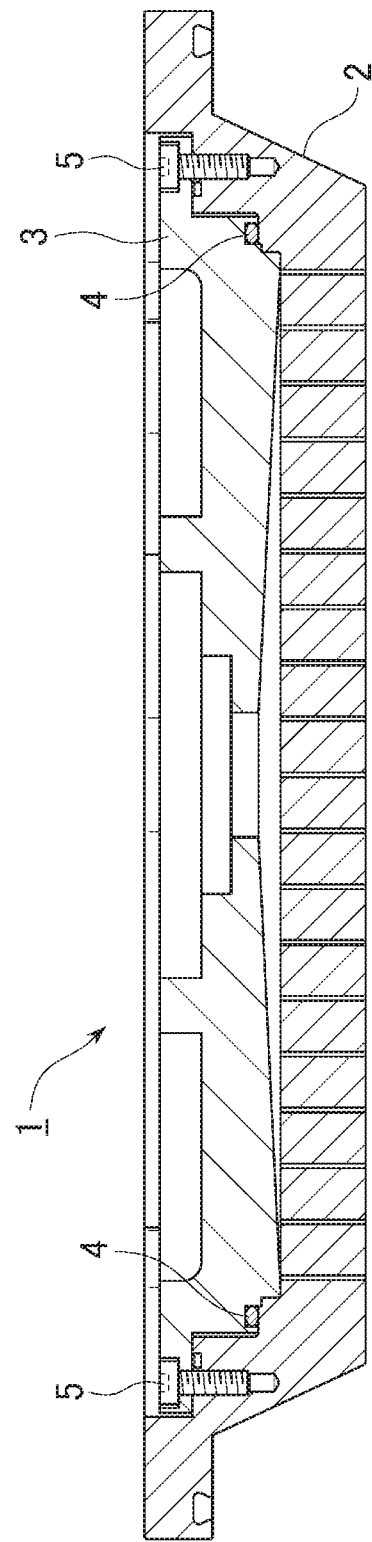
FIG. 1 is a schematic view of a conventional shower head having a shower plate structure and a shield plate.

The present invention includes, but is not limited to, the following embodiments:

As an example of a process, plasma enhanced ALD (PEALD) processes are explained to better understand when and how the shower plate is used to deposit films. Needless to say, the shower plate can alternatively or additionally be used in a PECVD process. However, embodiments of the present invention are not limited to use only in PEALD and PECVD processes.

As explained above, the shower plate can be used in PECVD and PEALD processes. In PEALD processes, a substrate or workpiece is placed in a reaction chamber and subjected to alternately repeated surface reactions. Thin SiN films are formed by repetition of a self-limiting ALD cycle. Desirably, for forming SiN films, each ALD cycle comprises at least two distinct phases. The provision and removal of a reactant from the reaction space may be considered a phase. In a first phase, a first reactant comprising silicon is provided and forms no more than about one monolayer on the substrate surface. This reactant is also referred to herein as "the silicon precursor," "silicon-containing precursor," "halogen-containing silicon precursor" or "silicon reactant" and may be, for example, $H_2SiI_2$, $(SiI_2)(NH_2)_2$, $(SiI_2)(NHMe)_2$, $(SiI_2)(NHEt)_2$, $(SiI_2)(NH^iPr)_2$, $(SiI_2)(NH^tBu)_2$, $(SiI_2)(NMe_2)_2$, $(SiI_2)(NMeEt)_2$, $(SiI_2)(NMe^iPr)_2$, $(SiI2)(NMe^tBu)_2$, $(SiI_2)(NEt_2)_2$, $(SiI_2)(NEt^iPr)_2$, $(SiI_2)(NEt^tBu)_2$, $(SiI_2)(N^iPr_2)_2$, $(SiI_2)(N^iPr^tBu)_2$, and $(SiI_2)(N^tBu)_2$.

In a second phase, a second reactant comprising a reactive species is provided and may convert adsorbed silicon to silicon nitride. The second reactant may comprise a nitrogen precursor. The reactive species may comprise an excited species. These reactive species from noble gases do not necessarily contribute material to the deposited film, but can in some circumstances contribute to film growth as well as help in the formation and ignition of plasma. In some embodiments a gas that is used to form a plasma may flow constantly throughout the deposition process but only be activated intermittently.

Additional phases may be added and phases may be removed as desired to adjust the composition of the final film. One or more of the reactants may be provided with the aid of a carrier gas, such as Ar or He. The silicon precursor and the second reactant are provided with the aid of a carrier gas. Two of the phases may overlap, or be combined. For example, the silicon precursor and the second reactant may be provided simultaneously in pulses that partially or completely overlap. In addition, although referred to as the first and second phases, and the first and second reactants, the order of the phases may be varied, and an ALD cycle may begin with any one of the phases. That is, unless specified otherwise, the reactants can be provided in any order, and the process may begin with any of the reactants.

Next, the configuration of the plasma deposition apparatus is explained in detail below.

Figure 2:
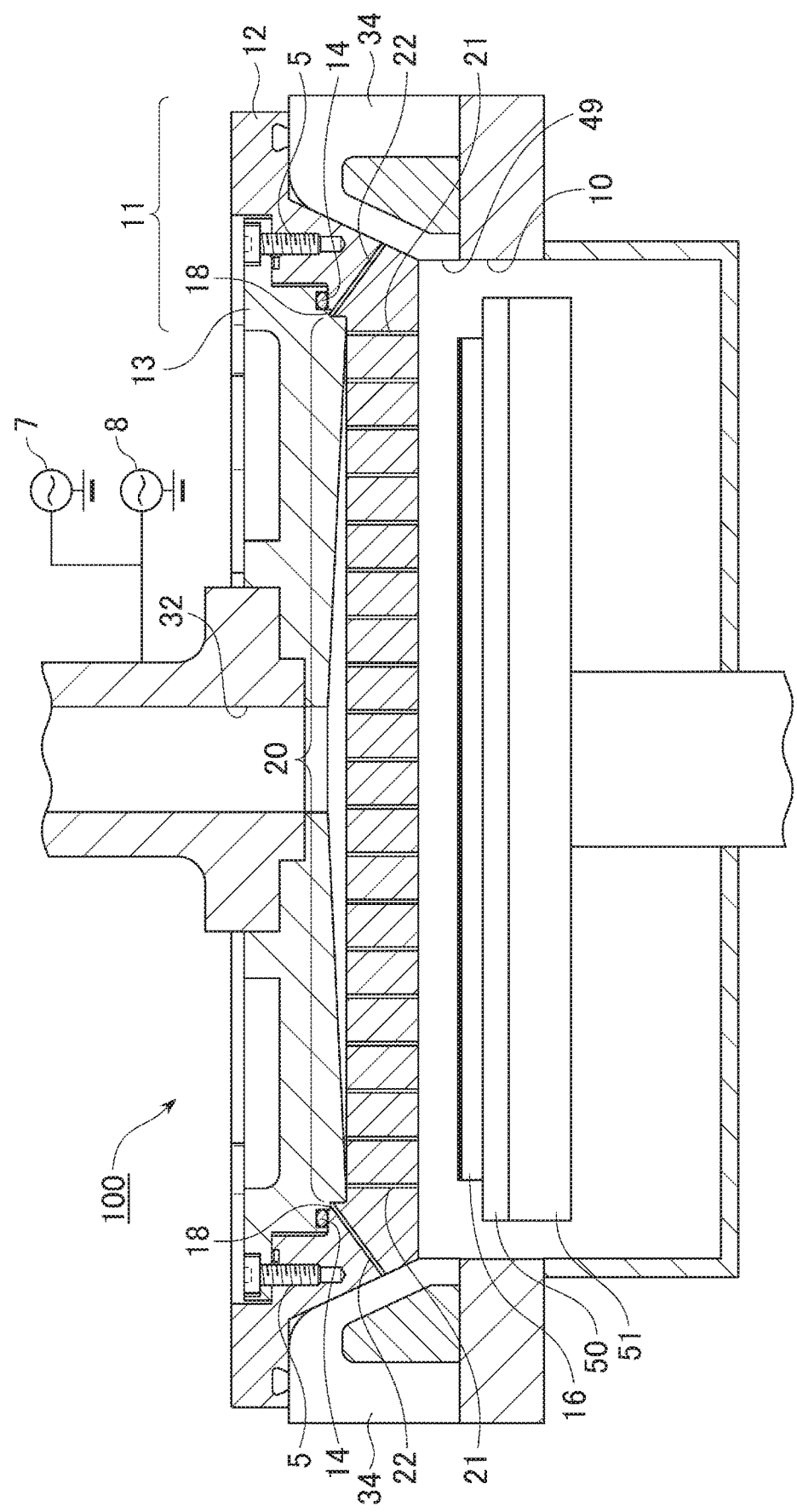
FIG. 2 is a schematic view of a PEALD apparatus showing a basic structure according to an embodiment.

As an example of the plasma deposition apparatus, FIG. 2 shows a schematic view of an embodiment of a PEALD apparatus. As noted above, the shower plate can be used additionally or alternatively in a PECVD process, or used in an entirely different process other than a PEALD or PECVD process. As shown in FIG. 2, the PEALD apparatus 100 comprises a vacuum (reaction) chamber 10, a showerhead 11 provided at the top of the vacuum chamber 10 and insulated from the vacuum chamber 10, a susceptor 50 provided inside the vacuum chamber 10 substantially parallel to the showerhead 11, and RF power sources 7 and 8 connected to a gas duct attached to the showerhead 11. The vacuum chamber 10 has an opening with an exhaust valve 49 at its side portion and comprises an exhaust duct 34 (exhaust port) connected to an exhaust pump (not shown). Additionally, the vacuum chamber 10 is grounded. The vacuum chamber 10 also has an opening with a gate valve (not shown) on an inner side wall for substrate transfer.

Figure 3:
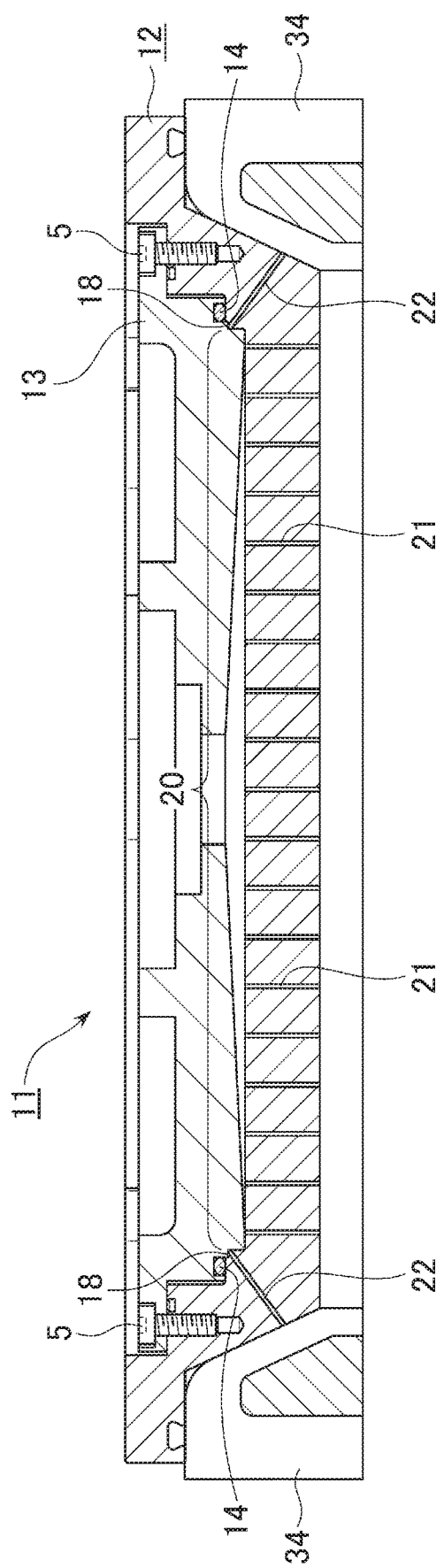
FIG. 3 is a schematic view of an embodiment of a shower plate structure with a plurality of apertures at stepped section.
Figure 5:
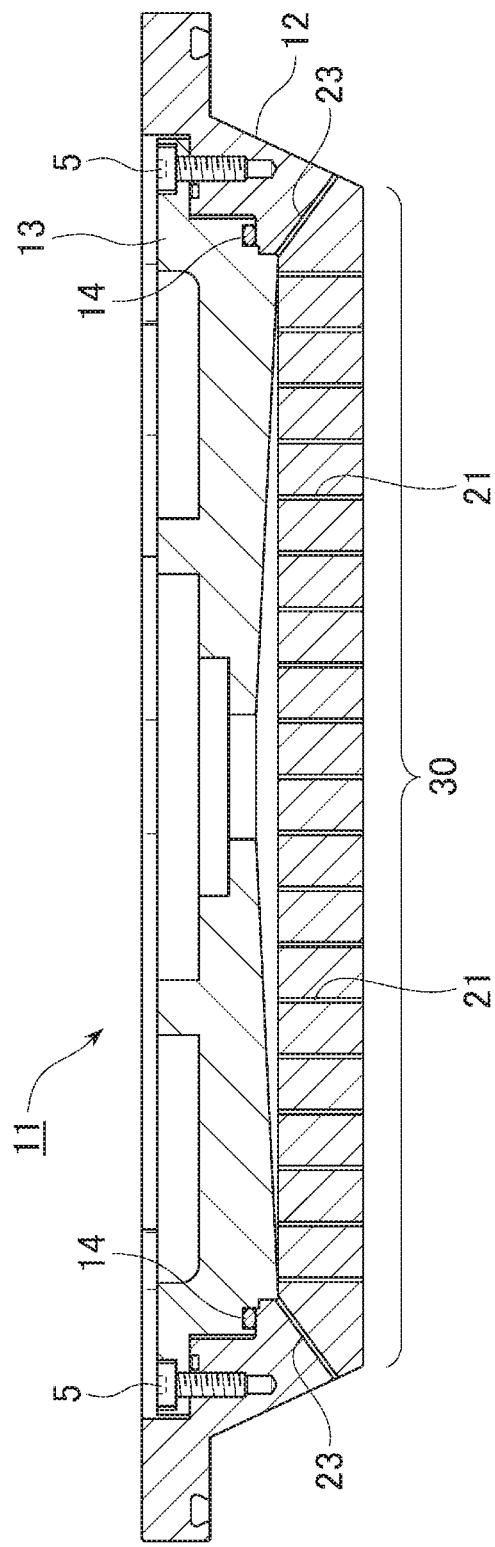
FIG. 5 is a schematic view of an embodiment of a shower plate structure with a plurality of apertures at stepped section.

The showerhead 11 has a hollow structure, and an upper tubular portion comprises a gas inlet port 32 (gas inlet space) connected to a gas line (not shown). Additionally, at the bottom face of the showerhead 11, a shower plate structure 12 (shower plate) is removably attached. In the shower plate structure 12, many gas outlet apertures 21 (holes or pores) as illustrated in FIGS. 3, 5 and 7 are formed so that a jet of a source gas introduced from the gas inlet port 32, which is at least partially defined by the shower plate structure 12 and a shield plate 13, is emitted from the apertures toward the susceptor 50. By removably attaching the shower plate structure 12, maintenance becomes easier and part replacement-related costs can be curtailed. The susceptor 50 is attached to a heater 51 at the lower end of the susceptor 50. The susceptor 50 is disposed substantially parallel to the shower plate structure 12 and holds a substrate (a substrate) 16 placed on its upper surface.

Figure 8:
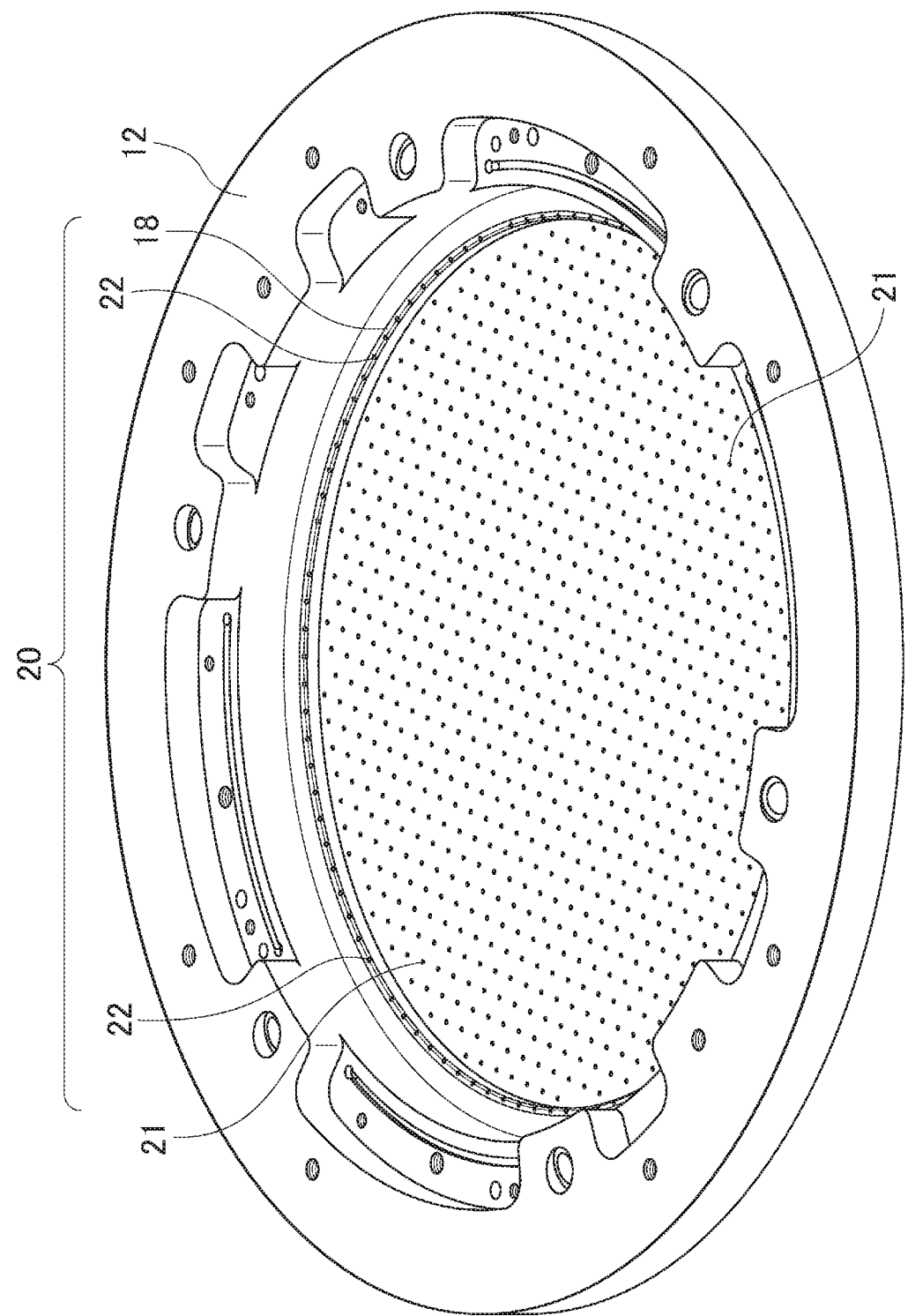
FIG. 8 is a schematic drawing of a perspective view of a shower plate on the front side.

In FIG. 2, the shower plate structure 12 and the shield plate 13 are fixed to one another with a screw 5, and an O-ring 14 is attached between the shower plate structure 12 and the shield plate 13. In one embodiment, the shower plate 12 also has a stepped section 18 on the front surface side of the shower plate structure 12, and a front surface area 20 (a front surface) is surrounded peripherally (e.g., circumferentially) by the stepped section 18 and the at least one aperture 22 (desirably a plurality of apertures (holes)) extends from the surface of the stepped section 18 to the exhaust duct 34 for passing by-product gas therethrough in this direction. FIG. 8 shows schematic illustration of a top perspective view of the shower plate structure 12 in which a plurality of gas outlet apertures 21, a plurality of apertures 22, the stepped section 18 and the front surface area 20 of the shower plate structure 12 are depicted.

By-product gas formed during the deposition process and leaked to areas around the ends of the gas inlet port and around the O-ring 14 (sometimes called a "microleak") has a negative impact on the uniformity of thickness of film deposited on the surface of a substrate. However, as in FIG. 2, by additionally forming at least one aperture 22 from the surface of the stepped section 18 to the exhaust duct 34 it is possible to effectively emit such problematic by-product gas to the exhaust duct 34 directly from areas around the O-ring 14, which is located on top of the stepped section 18. In one embodiment, to exhaust such by-product gas, at least one aperture is formed from the edge of the stepped section 18 of the shower plate 12 to the exhaust duct 34 on the rear side of the shower plate 12. In one embodiment, at least one aperture 22 may be formed extending from the surface of the sidewall of the stepped section 18 to the exhaust duct and is also effective in passing by-product gas therethrough.

In one embodiment, the at least one aperture extending from the surface of the stepped section to the exhaust duct may be inclined with respect to the direction perpendicular to the surface of the stepped section. In one embodiment, the at least one aperture may extend from the front surface of the shower plate to the exhaust duct. The at least one aperture extending from the front surface of the shower plate to the exhaust duct may be inclined with respect to the direction perpendicular to the front surface of the shower plate.

In one embodiment, the shower plate may have at least one aperture extending from the edge of the front surface or at the location within 5 millimeters inwards of the edge of the front surface. In another embodiment, the shower plate has at least one aperture extending from around the edge of the front surface of the shower plate to the exhaust gas.

In one embodiment, the shower plate may have, alternatively or additionally, at least one aperture extending from the edge of the front surface or the location within 5 millimeters inwards from the edge of the front surface of the shower plate to the rear surface thereof for indirectly passing by-product gas from the front surface side of the shower plate to the exhaust duct. In another embodiment, the shower plate has at least one aperture extending from around the edge of the front surface of the shower plate to the rear surface thereof for indirectly passing by-product gas from the front surface side of the shower plate to the exhaust duct.

In one embodiment, the direction of the at least one aperture extending from around the edge of the front surface of the shower plate to the rear surface thereof is substantially the same as the directions of the multiple apertures each extending from the front surface to the rear surface. In another embodiment, at least one aperture extending from around the edge of the front surface of the shower plate to the rear surface thereof is inclined with respect to the direction perpendicular to the front surface of the shower plate.

Embodiments of the present invention will be explained in detail with reference to specific examples which are not intended to limit the present invention. The numerical numbers applied in specific examples may be modified by a range of at least ±50%, wherein the endpoints of the ranges may be included or excluded.

EXAMPLES

An embodiment of the present invention will now be explained with reference to the following examples, which is not intended to limit the scope of the present invention.

Example 1

Shower plate with a plurality of apertures extending from the surface of the stepped section to the exhaust duct.

A schematic view of an embodiment of a shower plate structure with a shield plate (the shower head) is shown in FIG. 3. The shower head 11 has a shower plate structure 12 and a shield plate 13 which partially define a gas inlet space. The shower plate structure 12 and the shield plate 13 are fixed with a screw 5. An O-ring 14 is attached between the shower plate structure 12 and the shield plate 13. The shower plate 12 has a stepped section 18 on the front surface side of the shower plate 12, and a front surface area 20 (a front surface) is surrounded peripherally by the stepped section 18. At least one aperture 22 extends from the surface of the stepped section 18 to the exhaust duct for passing by-product gas therethrough in this direction.

Configuration of the Aperture 22
Number of apertures: 96
Diameter: 1 mm
Length: 33.88 mm
Inclined angle of the aperture with respect to the direction perpendicular to the front surface of the shower plate: 51.5°
Location of the aperture: Edge of the stepped section A precursor gas or gas mixture in the gas inlet space is introduced via a number of apertures (holes) 21 of the shower plate structure into the chamber. By-product gas formed during the deposition process and leaked to areas around the ends of the gas inlet port and around the O-ring 14 (sometimes called a "microleak") has negative impact on the uniformity of thickness of film deposited on the surface of a substrate.

It was found that this problem can be substantially avoided or reduced by exhausting such by-product gas from the areas around the O-ring 14 to the exhaust duct 34. To exhaust such by-product gas, a number of apertures 22 (for example, 96 apertures) are formed from the edge of the stepped section 18 of the shower plate 12 to the exhaust duct 34 on the rear side of the shower plate 12. It was found out that at least one aperture 22 extending from the surface of the sidewall of the stepped section 18 to the exhaust duct is also effective in passing by-product gas therethrough.

The experimental result is shown in FIG. 4. FIG. 4 shows a map of thickness ratio of each location of film formed on the surface of a substrate. The variation in the gray scale shows variation in the thickness of the film. The resultant map shows a thickness of film at each point relative to the average thickness of the film, ranging from −3.0% of the average thickness of the film to +3.0% of that of the film. The thickness of the film was measured at 49 locations of the film and the average thickness was calculated based upon such measurements.

From this map, a standard deviation value of the film thickness was calculated to be 1.0[1sigma %] in this example with the average film thickness of 27.6 [nm]. The lower the standard deviation value becomes, the better the film uniformity becomes. For purposes of comparison, in a conventional shower plate as described in FIG. 1, the standard deviation value of the film thickness was calculated to be 28.1 [1sigma %] under the same conditions except for the aperture 22 adopted in this example. It was found out that, if the standard deviation value of the film thickness is 15.0[1sigma %] or less, it can be concluded that the film exhibits favorable film deposition quality (film thickness uniformity) compared to that of a conventional film deposition method. It was found out that, if the standard deviation value of the film thickness is 10.0[1sigma %] or less, it can be concluded that the film exhibits more favorable film deposition quality.

Example 2

Shower plate with a plurality of apertures extending from the edge of the front surface to the exhaust duct.

A schematic view of an embodiment of a shower plate structure with a shield plate (the shower head) is shown in FIG. 5. The shower head 11 has a shower plate structure 12 and a shield plate 13 which define a gas inlet space. The shower plate structure 12 and the shield plate 13 are fixed with a screw 5. An O-ring 14 is attached between the shower plate structure 12 and the shield plate 13. The shower plate 12 has a stepped section 18 on the front surface side of the shower plate 12, and a front surface area 20 (a front surface) is surrounded peripherally by the stepped section 18. At least one aperture 23 extends from the edge of the front surface 20 of the shower plate structure 12 to the exhaust duct for passing by-product gas therethrough in this direction.

Configuration of the Aperture 23
Number of apertures: 96
Diameter: 1 mm
Length: 31.93 mm
Inclined angle of the aperture with respect to the direction perpendicular to the front surface of the shower plate: 47.5°
Location of the aperture: Edge of the front surface of the shower plate A precursor gas or gas mixture in the gas inlet space is introduced via a number of apertures (holes) 21 of the shower plate structure into the chamber. By-product gas formed during the deposition process and leaked to areas around the ends of the gas inlet port and around the O-ring 14 (sometimes called a "microleak") has a negative impact on the uniformity of thickness of film deposited on the surface of a substrate.

It was found out that this problem can be substantially avoided or reduced by exhausting such by-product gas from those areas to the exhaust duct 34. To exhaust such by-product gas, a number of apertures 23 (e.g., 96 apertures) is formed from the edge of the front surface 20 of the shower plate 12 to the exhaust duct on the rear side 30 of the shower plate 12.

Although not shown, an experimental result of this example was obtained. The result was derived also in the form of a map of thickness ratio of each location of film formed on the surface of the substrate.

From the resultant map (not shown), a standard deviation value of the film thickness was calculated to be 5[1sigma %] in this example with the average film thickness of 25 [nm]. It was also found that the shower plate 12 with apertures extending from the location of the front surface within 2 millimeters inwards of the edge thereof exhibits a similar standard deviation value of the film thickness. As with the above, the lower the standard deviation value becomes, the better the film uniformity becomes. For purposes of comparison, in a conventional shower plate as described in FIG. 1, the standard deviation value of the film thickness was calculated to be 28.1 [1sigma %] under the same conditions except for the aperture 23 adopted in this example. It was found out that, if the standard deviation value of the film thickness is 15.0[1sigma %] or less, it can be concluded that the film exhibits favorable film deposition quality (film thickness uniformity) compared to that of a conventional film deposition method. It was found out that, if the standard deviation value of the film thickness is 10.0[1sigma %] or less, it can be concluded that the film exhibits more favorable film deposition quality.

Example 3

Shower plate with a plurality of apertures extending from the edge of the front surface of the shower plate to the rear surface thereof.

Figure 6:
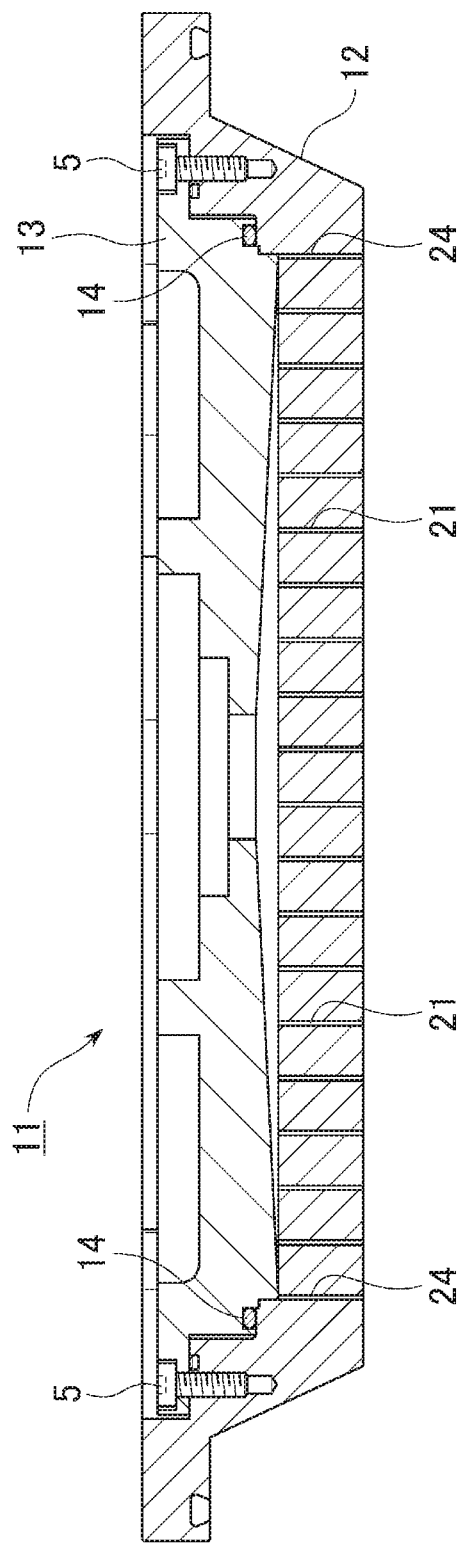
FIG. 6 is a schematic view of an embodiment of a shower plate structure with a plurality of apertures at stepped section.

A schematic view of an embodiment of a shower plate structure with a shield plate (the shower head) is shown in FIG. 6. The shower head 11 has a shower plate structure 12 and a shield plate 13 which define a gas inlet space. The shower plate structure 12 and the shield plate 13 are fixed with a screw 5. An O-ring 14 is attached between the shower plate structure 12 and the shield plate 13. The shower plate 12 has a stepped section 18 on the front surface side of the shower plate 12, and a front surface area 20 (a front surface) is surrounded peripherally by a stepped section 18. At least one aperture 24 extends from the edge of the front surface 20 of the shower plate 12 to the rear surface 30 of the shower plate 12.

Configuration of the Aperture 24
Number of apertures: 102
Diameter: 1 mm
Length: 25 mm
Location of the apertures: Edge of the front surface of the shower plate A precursor gas or gas mixture in the gas inlet space is introduced via a number of apertures (holes) 21 of the shower plate structure into the chamber. By-product gas formed during the deposition process and leaked to areas around the ends of the gas inlet port and around the O-ring 14 (sometimes called a "microleak") has negative impact on the uniformity of thickness of film deposited on the surface of a substrate.

It was found out that this problem can be substantially avoided or reduced, albeit to a lesser degree, by exhausting such by-product gas indirectly from those areas to the exhaust duct 34. To exhaust such by-product gas, a number of apertures 24 (e.g., 102 apertures) are formed from the edge of the front surface 20 of the shower plate 12 to the rear surface 30 of the shower plate 12. In this example, although the exhaust effect is more distinctive when exhausting directly from the edge of the front surface 20 of the shower plate 12 to the exhaust duct 34, it was found that by-product gas could also be exhausted to the exhaust duct 34 through the reaction chamber 10 (indirect exhaustion).

The experimental result of this example is shown in FIG. 7. FIG. 7 shows a map of thickness ratio of each location of film formed on the surface of a substrate. The variation in the gray scale shows variation in the thickness of the film. The resultant map shows a thickness of film at each point relative to the average thickness of the film, ranging from −3.0% of the average thickness of the film to +3.0% of that of the film. The thickness of the film was measured at 49 locations of the film and the average thickness was calculated based upon such measurements.

From this map, the standard deviation value of the film thickness was calculated to be 13.7[1sigma %] in this example with the average film thickness of 31.2 [nm]. It was also found that the shower plate 12 with apertures extending from the location of the front surface within 2 millimeters inwards from the edge thereof exhibits a similar standard deviation value of the film thickness. As with the above, the lower the standard deviation becomes, the better the film uniformity becomes. For purposes of comparison, in a conventional shower plate as described in FIG. 1, the standard deviation value of the film thickness was calculated to be 28.1 [1sigma %] under the same conditions except for the aperture 24 adopted in this example. It was found out that, if the standard deviation value of the film thickness is 15.0[1sigma %] or less, it can be concluded that the film exhibits favorable film deposition quality (film thickness uniformity) compared to that of a conventional film deposition method.

With respect to the use of substantially any plural and/or singular terms herein, those having skill in the art can translate from the plural to the singular and/or from the singular to the plural as is appropriate to the context.

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed is:

1. A shower plate adapted to be installed in a plasma deposition apparatus comprising a gas inlet port, a shower head, a workpiece support, a reaction chamber and an exhaust duct, the shower plate being adapted to be attached to the showerhead and comprising:
a front surface adapted to face the gas inlet port; and
a rear surface opposite to the front surface,
wherein the shower plate has multiple apertures each extending from the front surface to the rear surface for passing gas therethrough in this direction, wherein the shower plate further has at least one aperture extending from the front surface side of the shower plate to the exhaust duct for passing by-product gas therethrough in this direction,
wherein the shower plate further has a stepped section at the front surface side of the shower plate, the front surface surrounded peripherally by the stepped section, the stepped section having a first surface extending at an angle to the front surface and a second surface, above the first surface, extending at a non-perpendicular angle to the first surface, and the at least one aperture extends from at the second surface of the stepped section to the exhaust duct, and
wherein the at least one aperture at the second surface is higher than the multiple apertures at the front surface.

2. The shower plate according to claim 1, wherein the at least one aperture extending from at the second surface of the stepped is inclined with respect to a direction perpendicular to the first or second surface of the stepped section.

3. The shower plate according to claim 2, wherein the inclination angle of the at least one aperture extending from at the second surface of the stepped section with respect to the front surface of the shower plate is between 0-90°.

4. The shower plate according to claim 1, wherein the shower plate has a plurality of apertures extending from the front surface side of the shower plate to the exhaust duct, the plurality of apertures being substantially uniformly distributed peripherally.

5. The shower plate according to claim 1, wherein the shower plate has in the range of 90 to 120 apertures extending from the front surface side of the shower plate to the exhaust duct.

6. The shower plate according to claim 1, wherein the shower plate further has at least one aperture extending from the edge of the front surface, or a location within 2 millimeters inwards from the edge of the front surface of the shower plate, to the rear surface thereof for indirectly passing by-product gas from the front surface side of the shower plate to the exhaust duct.

7. The shower plate according to claim 1, wherein the shower plate further has at least one aperture extending from around the edge of the front surface of the shower plate to the rear surface thereof for indirectly passing by-product gas from the front surface side of the shower plate to the exhaust duct.

8. The shower plate according to claim 7, wherein the direction of the at least one aperture extending from around the edge of the front surface of the shower plate to the rear surface thereof is substantially the same as the directions of the multiple apertures each extending from the front surface to the rear surface.

9. The shower plate according to claim 7, wherein the at least one aperture extending from around the edge of the front surface of the shower plate to the rear surface thereof is inclined with respect to a direction perpendicular to the front surface of the shower plate.

10. The shower plate according to claim 9, wherein the inclination angle of the at least one aperture with respect to the front surface of the shower plate is between 0-90°.

11. A substrate processing apparatus comprising the shower plate according to claim 1.

12. A processing apparatus comprising:
a gas inlet port;
a shower head;
a workpiece support;
a reaction chamber;
an exhaust duct; and
a shower plate attached to the showerhead, the shower plate comprising:
a front surface adapted to face the gas inlet port, and
a rear surface opposite to the front surface,
wherein the shower plate has multiple gas supply apertures each extending from the front surface to the rear surface for passing gas therethrough in this direction, and
wherein the shower plate further has at least one gas exhaust aperture extending from the front surface side of the shower plate to the exhaust duct for passing by-product gas, from one or more of the gas supply apertures, therethrough in this direction, the at least one gas exhaust aperture connected into the exhaust duct at a location downstream of a port of the exhaust duct.

13. The processing apparatus according to claim 12, wherein the shower plate further has a stepped section on the front surface side of the shower plate, the front surface being surrounded peripherally by the stepped section and the at least one gas exhaust aperture extends from a surface of the stepped section to the exhaust duct.

14. The processing apparatus according to claim 12, wherein the processing apparatus is configured for deposition of a material on a workpiece.

15. The processing apparatus according to claim 12, wherein the shower plate has the at least one gas exhaust aperture extending from the front surface of the shower plate to the exhaust duct.

16. The processing apparatus according to claim 12, wherein the shower plate has the at least one gas exhaust aperture extending from the edge of the front surface, or at a location within 2 millimeters inwards from the edge of the front surface, to the exhaust duct.

17. The processing apparatus according to claim 12, wherein the shower plate has the at least one gas exhaust aperture extending from around the edge of the front surface of the shower plate to the exhaust duct.

18. The processing apparatus according to claim 12, wherein the at least one gas exhaust aperture extending to the exhaust duct is inclined with respect to a direction perpendicular to the front surface of the shower plate.

19. The processing apparatus according to claim 12, wherein the shower plate has a plurality of gas exhaust apertures extending from the front surface side of the shower plate to the exhaust duct, the plurality of gas exhaust apertures being substantially uniformly distributed peripherally.

20. A processing apparatus comprising:
   a gas inlet port;
   a shower head;
   a workpiece support;
   a reaction chamber;
   an exhaust duct; and
   a shower plate attached to the showerhead, the shower plate comprising:
      a front surface adapted to face the gas inlet port, and
      a rear surface opposite to the front surface,
      wherein the shower plate has multiple gas supply apertures each extending from the front surface to the rear surface for passing gas therethrough in this direction, and
      wherein the shower plate further has at least one pas exhaust aperture extending from the front surface side of the shower plate to directly connect the exhaust duct for passing by-product gas, from one or more of the gas supply apertures, therethrough in this direction.

\* \* \* \* \*